Oct. 18, 1966 K. KADELBURG 3,280,388

HOUSING FOR MULTI-LEAD SEMICONDUCTOR DEVICE INCLUDING CRIMPING CONNECTION MEANS FOR ONE LEAD

Filed March 9, 1964 2 Sheets-Sheet 1

INVENTOR.
KURT KADELBURG

BY

OSTROLENK, FABER, GERB & SOFFEN
ATTORNEYS

Oct. 18, 1966 K. KADELBURG 3,280,388

HOUSING FOR MULTI-LEAD SEMICONDUCTOR DEVICE INCLUDING CRIMPING CONNECTION MEANS FOR ONE LEAD

Filed March 9, 1964 2 Sheets-Sheet 2

INVENTOR.
KURT KADELBURG
BY
OSTROLENK, FABER, GERB & SOFFEN
ATTORNEYS

United States Patent Office 3,280,388

Patented Oct. 18, 1966

3,280,388

HOUSING FOR MULTI-LEAD SEMICONDUCTOR DEVICE INCLUDING CRIMPING CONNECTION MEANS FOR ONE LEAD

Kurt Kadelburg, Los Angeles, Calif., assignor to International Rectifier Corporation, El Segundo, Calif., a corporation of California Filed Mar. 9, 1964, Ser. No. 350,434
3 Claims. (Cl. 317—234)

This invention relates to a housing structure for semiconductors, and more specifically relates to a novel lead connection arrangement for semiconductor housings wherein three insulated terminals must be provided.

While the present invention applies generally to semiconductor housings, it has particular usefulness for the housing of a controlling rectifier wherein a gate terminal must be insulated from the cathode and anode terminals.

In accordance with the invention, a novel conductive ring having a crimping terminal extending therefrom is subassembled in the controlled rectifier housing whereby the relatively fragile gate lead extending from the controlled rectifier wafer may be engaged with the external conductive ring by a crimp arrangement. This permits the final termination of the gate of the controlled rectifier to be a relatively heavy terminal, and considerably simplifies the assembly of a hermetically sealed housing for the wafer.

Accordingly, a primary object of this invention is to provide a novel housing arrangement for semiconductor devices.

Another object of this invention is to provide a novel terminal arrangement for the gate lead of a controlled rectifier.

Another object of this invention is to simplify manufacturing techniques for controlled rectifier-type devices.

A still further object of this invention is to provide a novel auxiliary terminal construction for hermetically sealed housings having terminals which must be insulated from one another extending therefrom.

These and other objects of this invention will become apparent from the following description when taken in connection with the drawings, in which.

Figure 1:
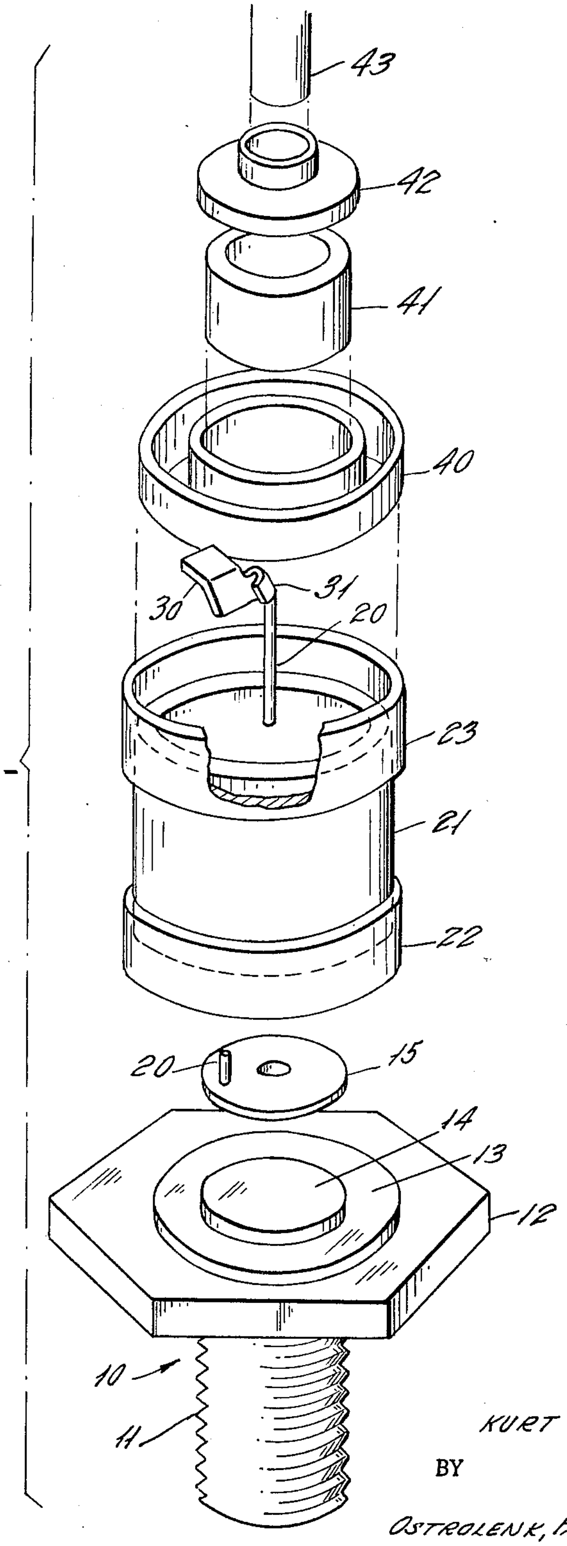
FIGURE 1 is an exploded perspective view of the novel housing arrangement of the invention.
Figures 2, 3, 4, 5, 6:
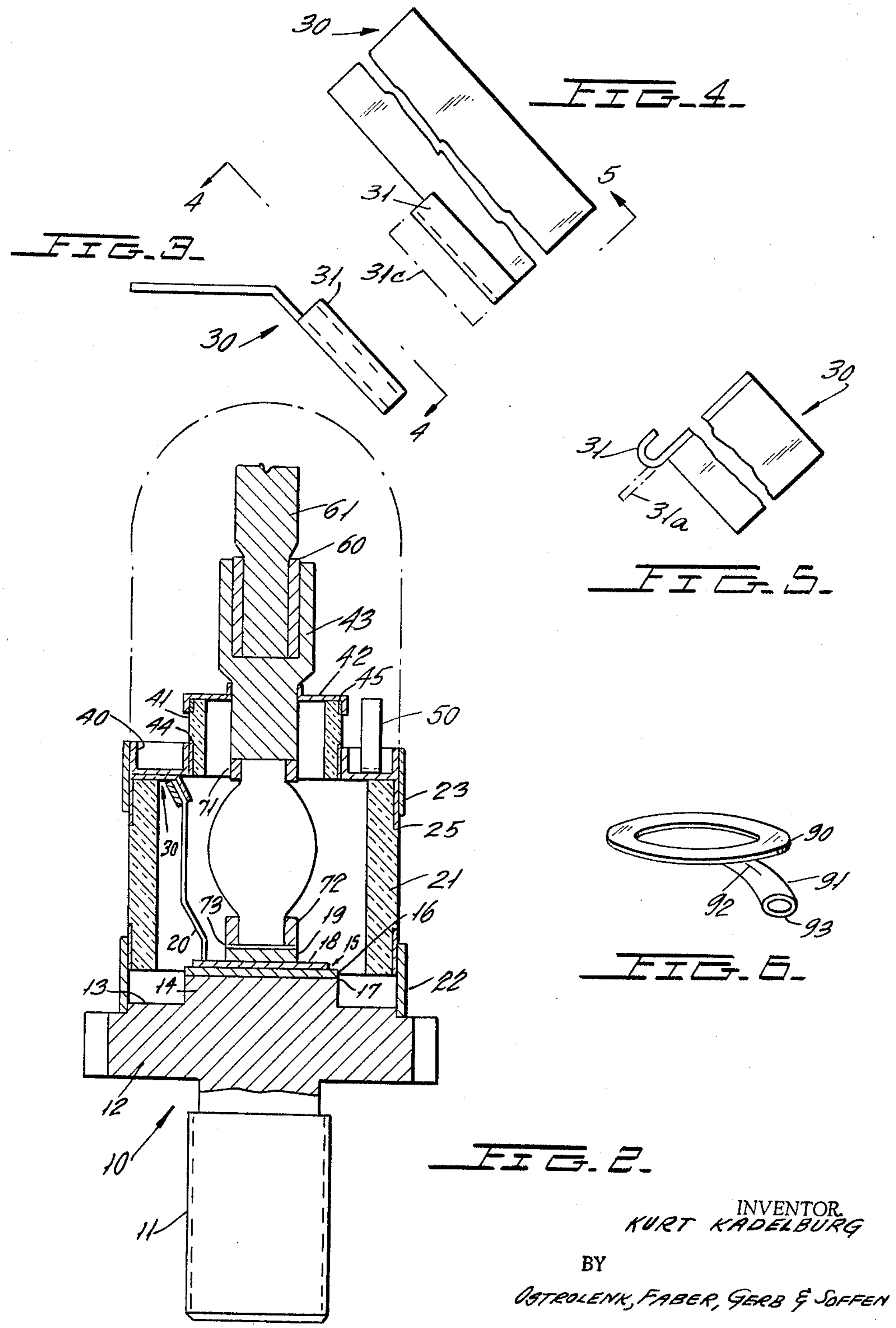
FIGURE 2 is a cross-sectional view of the assembled structure of FIGURE 1.
FIGURE 3 is a side plan view of the gate terminal of the invention.
FIGURE 4 is a plan view of FIGURE 3 when seen from the lines 4—4 in FIGURE 3.
FIGURE 5 is a plan view of FIGURE 4 when seen from the lines 5—5 in FIGURE 4.
FIGURE 6 shows a perspective view to illustrate the manner in which a full ring supports a small hollow tube for reception of the gate lead.

Referring now to the figures, and particularly FIGURES 1 and 2, the invention is illustrated for the case of a controlled rectifier structure. The controlled rectifier structure includes the rectifier base 10 which has a threaded section 11 and a hexagonal section 12 formed in the usual manner, and includes a first and second platform 13 and 14 respectively which are machined into the upper surface of base 10. The upper platform 14 serves to receive the semiconductor wafer assembly 15 which, for example, includes a silicon wafer having the required NPNP junctions formed therein for the construction of a controlled rectifier arrangement, and may additionally include suitable mounting wafers. By way of example, in FIGURE 2, the device 15 includes a molybdenum base 16 which is pre-assembled with a soldering disk 17 and the junction containing silicon wafer 18. A second molybdenum disk 19 may then be secured atop the wafer 18 for receiving one power lead of the device.

A gate lead 20 is also preconnected to the wafer arrangement, the gate lead 20 being connected to a suitable region of the wafer. Clearly, the other power lead of the device is connected directly to the rectifier base 10.

In order to hermetically house the wafer and at the same time insulate the three terminals of the wafer, a housing is formed of a ceramic cylinder 21 which is suitably brazed to upper and lower brazing rings 22 and 23 respectively. It will be understood that areas such as darkened areas 24 and 25 of cylinder 21 in FIGURE 2 are suitably metallized. While any brazing process may be used, one suitable process utilizes a silver-copper eutectic solder material with the brazing occurring in a hydrogen atmosphere at 850° C. The copper ring 22 is then brazed at its lower end to the periphery of platfor 13, as illustrated.

In accordance with the invention, a novel gate terminal structure 30 is brazed to the ring 23 at the same time that rings 22 and 23 are brazed to cylinder 21.

The novel gate terminal structure 30 is shown in detail in FIGURES 3, 4 and 5, and is formed of an elongated plate of suitable conductive material such as a nickel-iron alloy. This material may typically have a thickness of the order of 10 mils and may be roughly square in configuration.

A tongue 31 projects from one side portion of the terminal, and is rolled from the dotted line position **31*a* shown particularly in FIGURES 4 and 5 to the rolled position illustrated. This novel arrangement forms a crimpable structure whereby a lead can be inserted within the tongue or U-shaped extending portion 31** and crimped down upon the lead and thereafter brazed for a good electrical connection.

Thus, as shown in FIGURE 1 and 2, the extending lead 20 has been contained within U-shaped section 31 with the section crimped down upon the lead to form good electrical and mechanical connection with a suitable soldering or brazing operation following the crimp, if desired.

An upper welding ring 40 which has a U-shaped cross-section is then received in the upper end of ring 23 and seats atop ceramic body 21. The ring 40 is a part of a second subassembly which includes a second ceramic tube 41 secured to rings 40 and 42 through metallized coating sections 44 and 45 respectively, as is well known to those skilled in the art.

Note that a good electrical connection is made between the gate terminal 30 and ring 40 so that the ring 40, which may have an extending member 50 extending therefrom, serves as a large metallic volume connection for making electrical connection to the gate lead 20. Note also that the subassembly of ring 40, insulator 41, ring 42 and lead connector 43 is made after the gate lead 20 is securely connected to gate terminal 30.

The lead connector 43, which has been brazed or welded to ring 42, then has an opening therein for receiving a conductive ring 60 and one end of a flexible conductor 61. The conductor 61 serves as one power terminal for the device and clearly is insulated from both the base 10 and the ring 40 which serves as the connecting means for the gate terminal.

Included in the upper subassembly is a second flexible conductor schematically illustrated as flexible conductor 70 in FIGURE 2 which is connected to the bottom of connector 43 by a suitable welding ring 71. The lower end of flexible conductor 70 then has a welding ring 72 thereon which is suitably connected to molybdenum disk 19 as through a solder disk 73. Thus, the connector 43 is connected to the upper power electrode of the wafer 15.

Moreover, a good hermetic seal is formed between rings 42 and 40 and ceramic cylinder 41; and between rings 40 and 22 and ceramic cylinder 21. Thus, the area enclosing wafer 15 is a hermetically sealed area.

Alternatively to the gate lead receiving structure of FIGURES 1 through 5, a full ring 90, shown in perspective view in FIGURE 6, can be interposed between the top of insulator 21 and ring 40. A small conductive tube 91 which is flattened at one end 92 is then welded to ring 90 at the flattened portion 92, and the projecting open end 93 can then receive the gate lead 20 of FIGURE 2. The open end 93 is then crimped into engagement with gate lead 20.

Although this invention has been described with respect to its preferred embodiment, it should be understood that many variations and modifications will now be obvious to those skilled in the art, and it is preferred therefore that the scope of the invention be limited not by the specific disclosure herein but only by the appended claims.

The embodiments of the invention in which an exclusive privilege or property is claimed are defined as follows:

1. A housing for a semiconductor wafer having a first and second power terminal and a gate terminal having a lead extending therefrom; said housing comprising (a) a conductive base stud having a flat wafer receiving surface;

(b) a first insulation tube having spaced upper and lower brazing rings surrounding the upper and lower end respectively of said insulation tube and extending beyond the respective ends of said first insulation tube;

(c) a gate terminal conductor electrically connected to the interior of said upper brazing ring; said gate terminal conductor having a gate lead-receiving section for electrically and mechanically receiving said lead extending from said wafer by crimping;

(d) a second insulation tube having a smaller diameter than said first insulation tube and having spaced upper and lower brazing rings surrounding the upper and lower end respectively of said second insulation tube;

(e) a power terminal lead connected to said upper brazing ring of said second insulation tube and extending through said first and second insulation tubes and terminating on said first power terminal of said wafer;

(f) said wafer being mounted on said flat wafer-receiving surface of said conductive base stud; said second power terminal of said wafer being directly connected to said conductive base stud; said lower brazing ring of said first insulation tube being brazed to an annular area of said flat wafer-receiving surface surrounding said wafer; said lower brazing ring of said second insulation tube being brazed to said upper brazing ring of said first insulation tube.

2. The device as set forth in claim 1 where said gate terminal conductor is formed of a flat conductive member having a U-shaped extending section; said U-shaped extending section being crimped into engagement with said gate terminal lead.

3. The device as set forth in claim 1 where said lower brazing ring of said second insulation tube has a U-shaped cross-section; one leg of said U-shaped cross-section being connected to said second insulation tube; the other leg of said U-shaped cross-section being connected to said upper brazing ring of said first insulation tube.

References Cited by the Examiner

UNITED STATES PATENTS

| | | | |
|---|---|---|---|
| 2,439,947 | 4/1948 | Pontius | 29—155.55 |
| 3,011,113 | 9/1961 | Mueller | 317—236 |
| 3,068,382 | 12/1962 | Wagner | 317—234 |
| 3,160,800 | 12/1964 | Smart | 317—235 |
| 3,196,203 | 7/1965 | Keller | 174—52 |

JOHN W. HUCKERT, *Primary Examiner.*

A. M. LESNIAK, *Assistant Examiner.*